United States Patent
Hanafi et al.

(10) Patent No.: US 7,579,655 B2
(45) Date of Patent: Aug. 25, 2009

(54) TRANSISTOR STRUCTURE HAVING INTERCONNECT TO SIDE OF DIFFUSION AND RELATED METHOD

(75) Inventors: Hussein I. Hanafi, Basking Ridge, NJ (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 11/275,475

(22) Filed: Jan. 9, 2006

(65) Prior Publication Data

US 2006/0094182 A1    May 4, 2006

(51) Int. Cl.
*H01L 29/76* (2006.01)
(52) U.S. Cl. ................................. 257/349; 257/369
(58) Field of Classification Search .............. 257/349, 257/369
See application file for complete search history.

(56) References Cited

U.S. PATENT DOCUMENTS

| | | | |
|---|---|---|---|
| 5,554,870 A | 9/1996 | Fitch et al. | |
| 5,610,099 A | 3/1997 | Stevens et al. | |
| 6,001,674 A | 12/1999 | Wu | |
| 6,015,990 A | 1/2000 | Hieda et al. | |
| 6,191,457 B1 | 2/2001 | Prengle et al. | |
| 6,580,137 B2 | 6/2003 | Parke | |
| 2004/0075148 A1* | 4/2004 | Kumagai et al. | 257/369 |
| 2006/0240650 A1* | 10/2006 | Orlowski et al. | 438/514 |

* cited by examiner

*Primary Examiner*—Thomas L Dickey
(74) *Attorney, Agent, or Firm*—Anthony J. Canale; Hoffman Warnick LLC

(57) ABSTRACT

A transistor structure is disclosed including at least one transistor including a diffusion and an interconnect electrically connected to a side of the diffusion and a conductor in electrical contact with the interconnect. The low-resistivity local interconnect is advantageous for use with stressed liner films since a conductor can contact the interconnect at a distance from the diffusion, thus allowing electrical contact without having to interrupt the stress liner film where it is most effective. Several embodiments of methods of electrically connecting a diffusion to an interconnect are also disclosed.

9 Claims, 12 Drawing Sheets

TRANSISTOR STRUCTURE HAVING INTERCONNECT TO SIDE OF DIFFUSION AND RELATED METHOD

BACKGROUND OF THE INVENTION

1. Technical Field

The invention relates generally to semiconductor device fabrication, and more particularly, to a transistor structure having an interconnect to a side of a diffusion, which allows electrical connection to the diffusion without interrupting a stress liner film, and related methods.

2. Background Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed barrier silicon nitride liner films. For example, a tensilely stressed silicon nitride liner film may be used to cause tension in an NFET channel while a compressively-stressed silicon nitride liner film may be used to cause compression in a PFET channel. Accordingly, a dual/hybrid liner film scheme is necessary to induce the desired stresses in an NFET and adjacent PFET.

Stress liner films are now an integral part of leading edge high-performance technologies, in particular silicon-on-insulator (SOI) technologies. These films can provide performance gains on the order of the projected gains for an entire technology node. However, stress liner films suffer when structures such as local interconnects between gates interrupt the stress liner film. In particular, the interruptions dilute the mobility/performance enhancement of the stress liner films where they are most effective—close to the gate. Typically, the closer the contacts are the worse the effect is to the performance. One approach to this problem is to reduce the number of contacts. This solution, however, limits design possibilities and increases contact resistance. In other approaches, a silicide strap or a wire using higher levels of metal wiring is used. These approaches unfortunately result in higher resistance.

In view of the foregoing, there is a need in the art for an improved way to electrically connect an interconnect to a diffusion, especially where stress liner films are implemented.

SUMMARY OF THE INVENTION

A transistor structure is disclosed including at least one transistor including a diffusion and an interconnect electrically connected to a side of the diffusion and a conductor (e.g., a via) in electrical contact with the interconnect. The low-resistivity local interconnect is advantageous for use with stressed liner films since a conductor can contact the interconnect at a distance from the diffusion, thus allowing electrical contact without having to interrupt the stress liner film where it is most effective. Several embodiments of methods of electrically connecting a diffusion to an interconnect are also disclosed.

A first aspect of the invention provides a method of electrically connecting to a diffusion of a transistor, the method comprising the steps of: providing an interconnect electrically connected to a side of the diffusion; and electrically connecting a conductor to the interconnect.

A second aspect of the invention provides a transistor structure comprising: at least one transistor including a diffusion and an interconnect electrically connected to a side of the diffusion; and a conductor in electrical contact with the interconnect.

A third aspect of the invention provides a transistor structure comprising: at least one transistor including a diffusion and an interconnect electrically connected to a side of the diffusion; at least one stress liner film over the at least one transistor; and a conductor in electrical contact with the interconnect at a distance from the diffusion.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
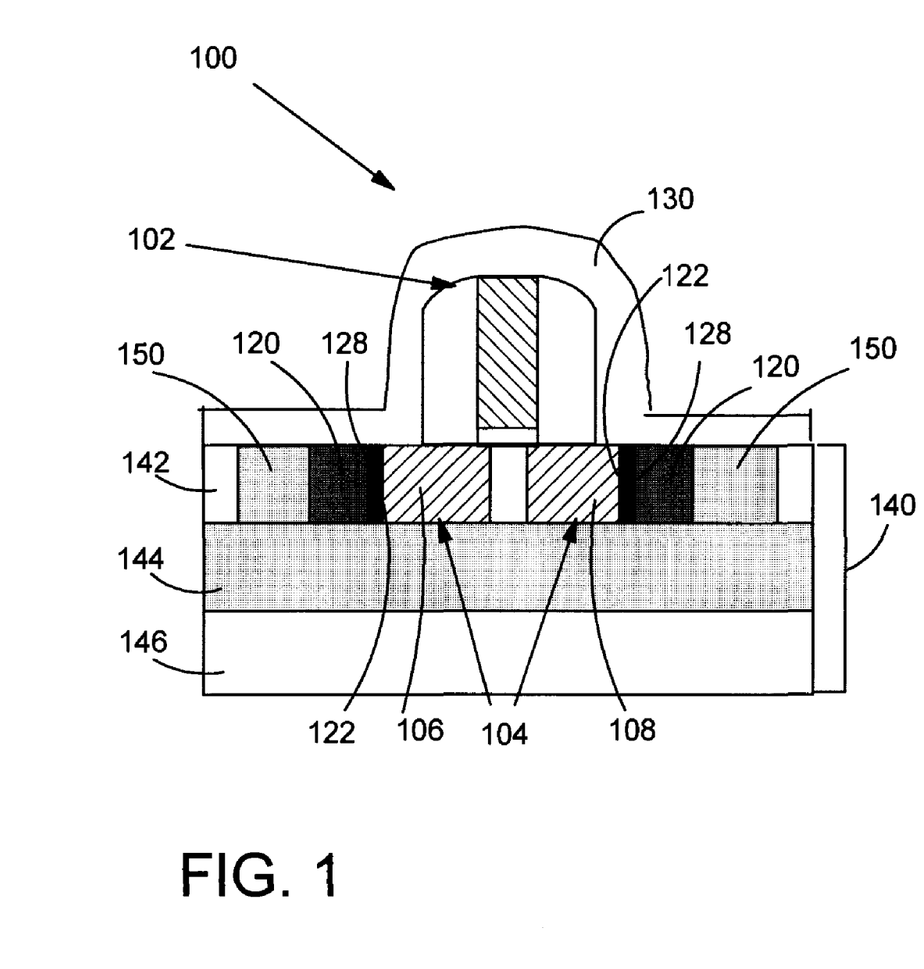
FIG. 1 shows a cross-sectional view of one embodiment of a transistor structure according to the invention.
Figure 2:
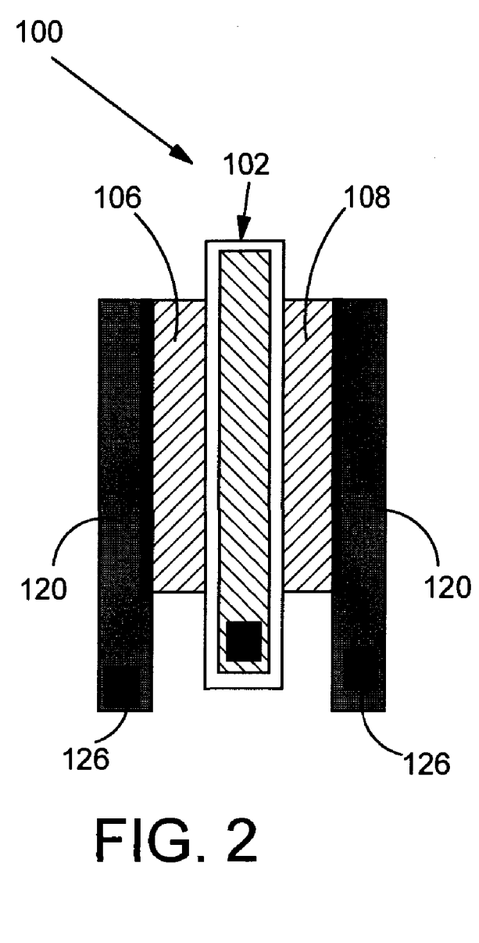
FIG. 2 shows a plan view of the transistor structure of FIG. 1.

Referring to FIG. 1, a cross-sectional view of one embodiment of a transistor structure 100 according to the invention is shown. FIG. 2 shows a plan view of the same structure, but without the top layer. Transistor structure 100 includes at least one transistor 102 including a diffusion 104, e.g., a source diffusion 106 and a drain diffusion 108. Transistor structure 100 also includes an interconnect 120 electrically connected to a side 122, i.e., vertical side, of at least one diffusion 104. Although shown with interconnect 120 to each of source diffusion 106 and drain diffusion 108, it should be recognized that only one interconnect 120 to one diffusion may be used, if desired. Each interconnect 120 may also include a silicide portion 128 in contact with side 122 (shown in FIG. 1). As shown in FIG. 2, transistor structure 100 also may include a conductor 126 such as a via or a buried interconnect (jumper wire) in electrical contact with interconnect 120.

Returning to FIG. 1, transistor structure 100 may also include a stress liner film 130 over the transistor structure. Stress liner film 130 may be a tensile stress liner film or a compressive stress liner film depending on the type of transistor, i.e., tensile for NFET and compressive for PFET. FIG. 2 shows that conductor 126 is distanced from diffusion(s) 106, 108. In this case, interconnect 120 provides a low-resistivity local interconnect to diffusion(s) 106, 108 and is especially advantageous for use with stressed liner films 130 since a conductor can contact interconnect 120 at a distance from the diffusion, thus allowing electrical contact without having to interrupt the stress liner film 130 where it is most effective.

As shown in FIG. 1, transistor structure 100 may be formed on a silicon-on-insulator (SOI) substrate 140 including a silicon-on-insulator layer 142, an insulator layer 144, e.g., of silicon dioxide ($SiO_2$), and a silicon-under-insulator layer 146. Alternatively, transistor structure 100 may be formed on bulk silicon. Transistor structure 100 may also include trench isolations 150 to isolate adjacent devices from one another. A dielectric used in trench isolation 150 may include, for example, tetraethyl orthosilicate (TEOS) or any other common trench isolation dielectric.

Figures 3, 4:
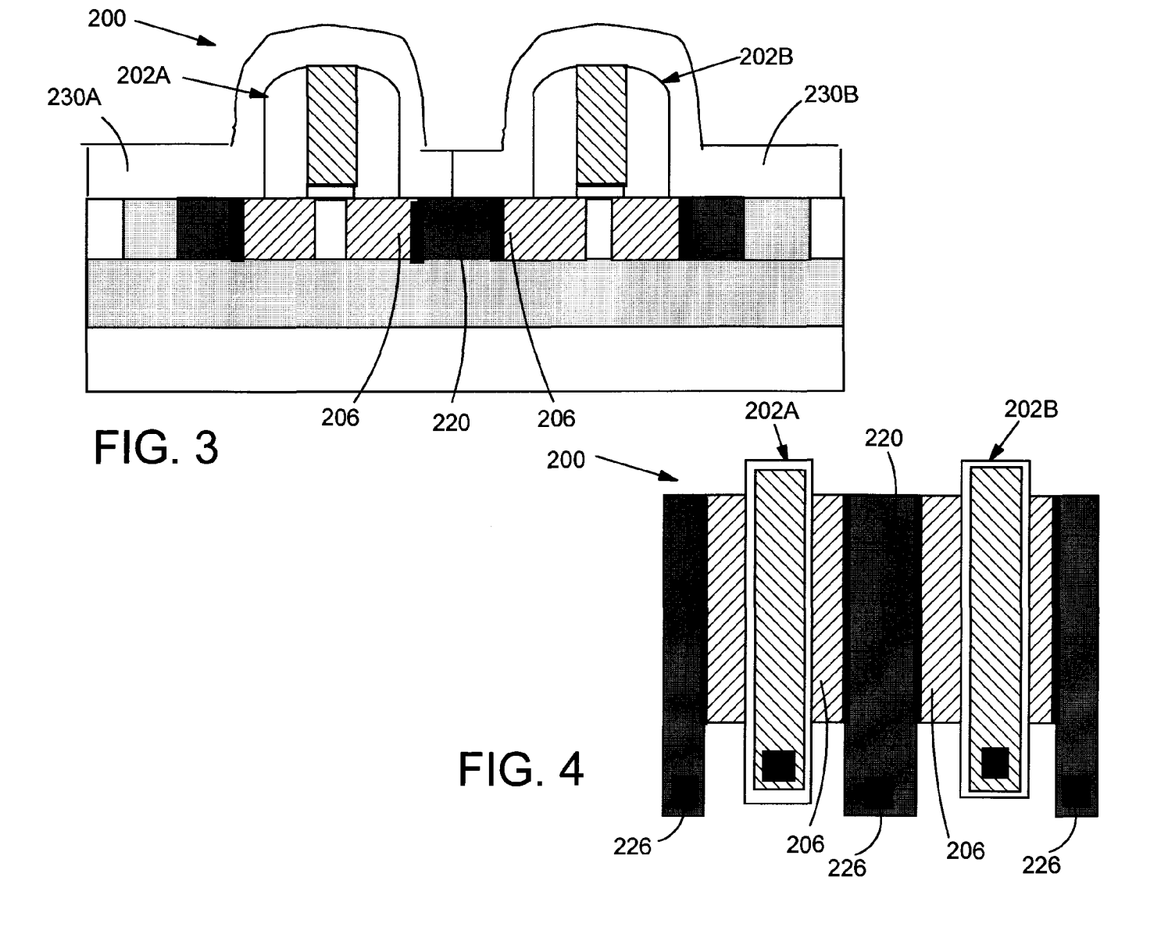
FIG. 3 shows a cross-sectional view of a second embodiment of a transistor structure according to the invention.
FIG. 4 shows a plan view of the transistor structure of FIG. 3.
Figure 5:
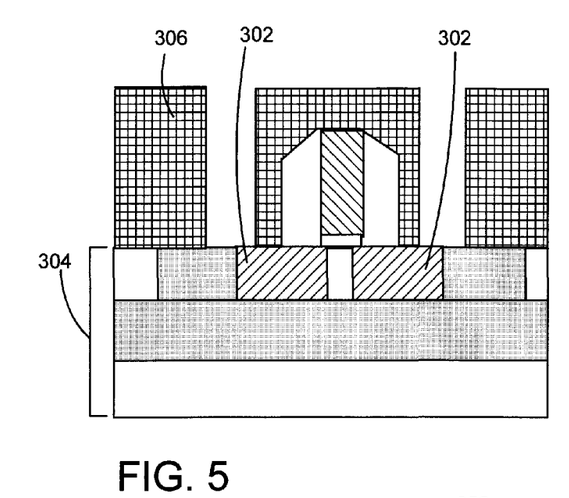
FIGS. 5-8 show a first embodiment of a method of electrically connecting to a diffusion of a transistor.

Turning to FIG. 3, another embodiment of a transistor structure 200 according to the invention is shown. FIG. 4 shows a plan view of the same structure, but without the top layer. In this embodiment, transistor structure 200 includes at least two transistors 202A, 202B. A pair of like diffusions 206 (i.e., source-and-source or drain-and-drain) of adjacent transistors 202A, 202B are each electrically connected to an interconnect 220 therebetween, i.e., they share interconnect 220. In this case, each transistor 202A, 202B may have a different type of stress liner film thereover, i.e., this is a dual stress liner scheme. For example, a tensile stress liner film 230A may be applied over at least one transistor 202A, and a compressive stress liner film 230B may be applied over at least one other transistor 202B. As shown in FIG. 4, this embodiment may also include a conductor 226 electrically connected to interconnect 220 at a distance from diffusions, e.g., diffusion 206.

Turning to FIGS. 5-25, various embodiments of methods of electrically connecting to diffusion(s) 106, 108, 206 of transistor 102, 202A, 202B (and forming the above-described structures 100, 200) will now be described. Hereinafter, the various embodiments of the method will be described relative to the single transistor 102 embodiment of FIGS. 1-2 for brevity, unless otherwise necessary. As one with skill in the art will understand, however, the teachings are applicable to schemes having any number of transistors. Generally, one embodiment of the method includes providing an interconnect 120 electrically connected to a side 122 of a diffusion 106, 108, and electrically connecting a conductor 126 to interconnect 120. As will be described in greater detail below, each of the embodiments may finish with the step of applying at least one stress liner film 130, and electrically connecting conductor 126 at a distance from diffusion 106, 108, hence, preventing disruption of stress liner film 130. Stress liner film 130 may differ over different transistors.

Figure 6:
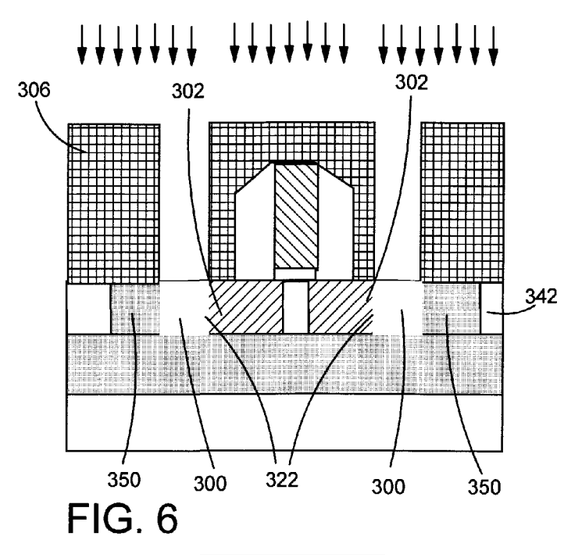

Referring to FIGS. 5-8, a first embodiment of the method implements the providing step by forming an opening 300 (FIG. 6) for an interconnect into at least a portion of an already formed diffusion 302. That is, an already formed diffusion 302 is provided in a substrate 304, e.g., an SOI substrate, using any conventional techniques. Then, opening 300 may be formed in any now known or later developed fashion such as forming, patterning and etching a mask 306 and then etching (FIG. 6) opening 300 for interconnect 120 using mask 306 into at least a portion of diffusion 302, thus forming an open side 322 (FIG. 6). Etching may include a silicon etch of a silicon-on-insulator layer 342 of diffusion 302.

Figure 7:
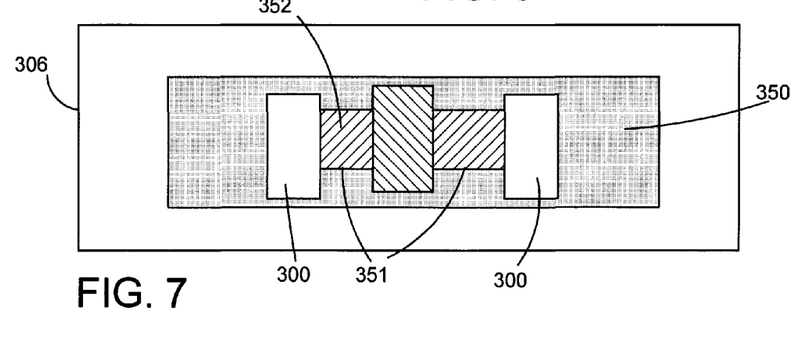
Figure 8:
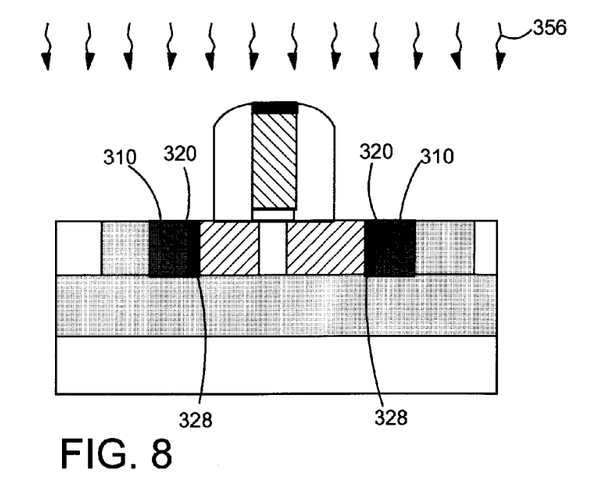

Opening 300 may also optionally be used to remove part of trench isolation 350 (FIGS. 6-7). A dielectric used in trench isolation 350 may include, for example, tetraethyl orthosilicate (TEOS), silicon dioxide ($SiO_2$), or any other common trench isolation dielectric. In this case, an anisotropic etch of trench isolation material, e.g., TEOS, silicon dioxide ($SiO_2$) or any other common trench isolation material, may be employed. FIG. 7 shows a plan view of opening(s) 300 (shading of mask 306 removed) illustrating how opening(s) 300 may extend beyond an edge 351 of a silicon island 352 for at least one transistor. Next, as shown in FIG. 8, mask 306 (FIGS. 5-6) is removed, e.g., by etching, and a conductor 310 is formed (sputtered or deposited) in opening 300 to form interconnect 320. Conductor 310 can be any conductive material conventionally used in semiconductor devices, e.g., metal, polysilicon, doped polysilicon, etc. Next, depending on the conductor material, an anneal 356 of conductor 310 may optionally be performed to form a silicide portion 328 within at least part of conductor 310. Any residual conductor 310 may be removed by any now known or later developed technique, e.g., wet/dry etching, chemical mechanical polishing (CMP), etc.

Figure 9:
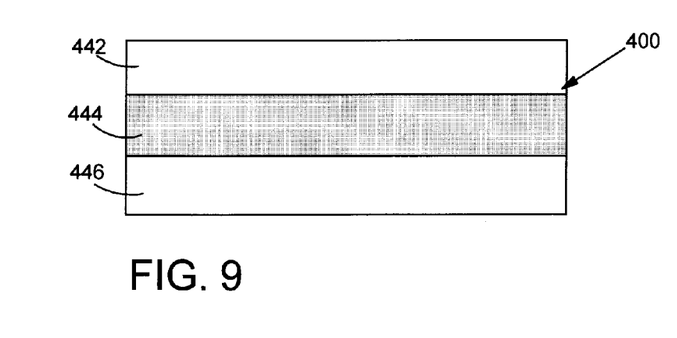
FIGS. 9-16 show a second embodiment of a method of electrically connecting to a diffusion of a transistor.
Figure 10:
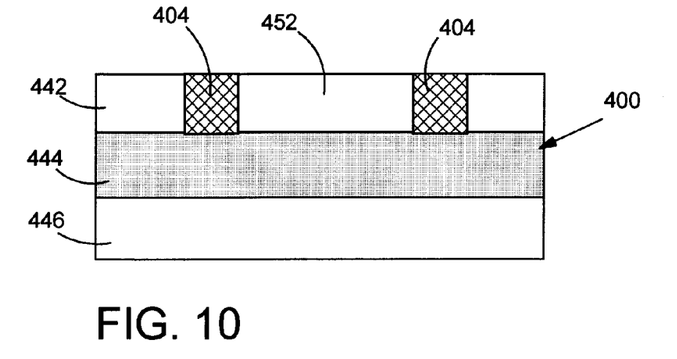
Figure 11:
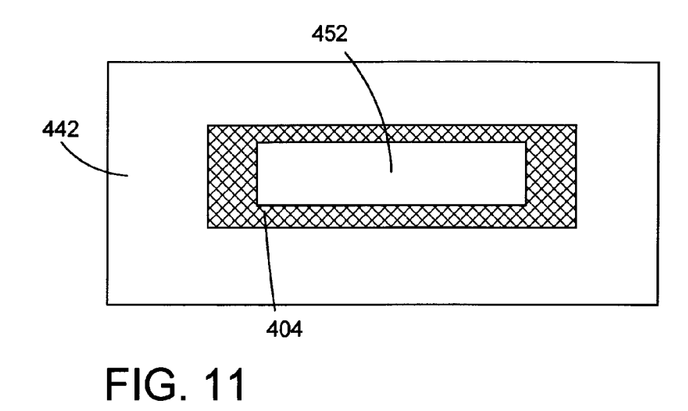
Figure 12:
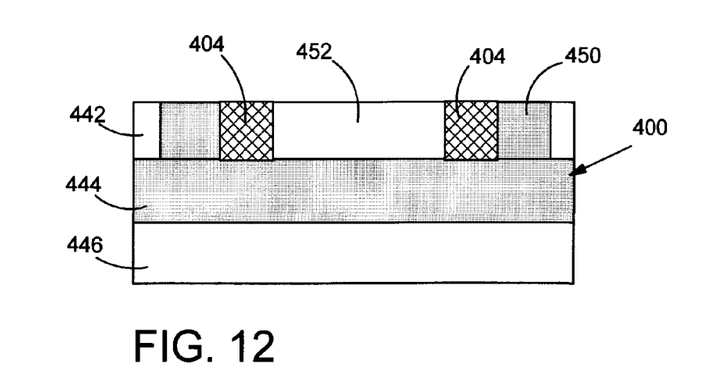
Figure 13:
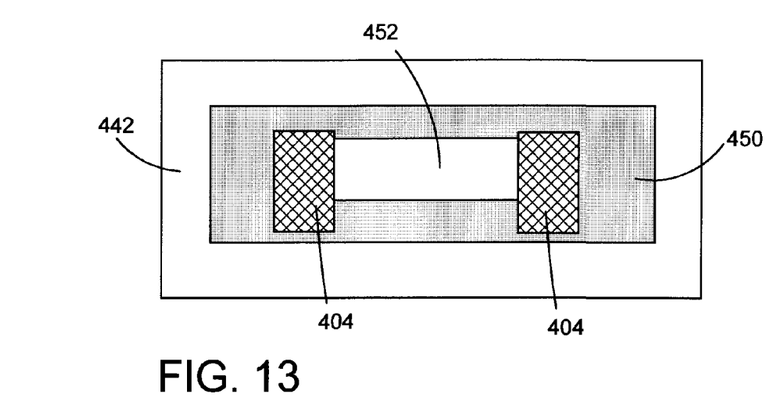

Turning to FIGS. 9-16, a second embodiment of the method implements the providing step by employing a sacrificial material region prior to formation of a diffusion, where the sacrificial material region defines the location of the interconnect. As shown in FIG. 9, this embodiment begins by providing a silicon-on-insulator (SOI) substrate 400. SOI substrate 400 may include, for example, a bonded SOI substrate or a separation by implantation of oxygen (SIMOX) substrate. SOI substrate 400 includes a silicon-on-insulator layer 442, an insulator layer 444, e.g., of silicon dioxide ($SiO_2$), and a silicon-under-insulator layer 446. Next, as shown in FIGS. 10 and 11, at least one sacrificial material region 404 is formed in at least silicon-on-insulator layer 442 of SOI substrate 400. Optionally, a silicon protect layer (e.g., a dielectric such as silicon nitride, not shown) can be used over areas such as the region where active devices (e.g., transistors) are formed to prevent damage from various processing steps. The protect layer is then removed at an appropriate time during subsequent device formation steps. Each sacrificial material region 404 will eventually become an interconnect. Sacrificial material may include, for example, germanium (Ge) and silicon germanium (SiGe). Next, as shown in FIGS. 12-13, a trench isolation 450 is formed to define a transistor region 452 in silicon-on-insulator layer 442. The trench isolation forming step may include any conventional techniques such as patterning and etching a mask, etching the trench, filling with dielectric, and CMP. The dielectric may include TEOS, silicon dioxide ($SiO_2$) or any other common trench isolation material. As shown, trench isolation 450 extends about each sacrificial material region 404 adjacent to each sacrificial material region 404. As shown in FIGS. 12 and 14-16, trench isolation 450 is a shallow trench isolation (STI), i.e., it extends only to insulator layer 444. A dielectric used in trench isolation 450 may include, for example, tetraethyl orthosilicate (TEOS) or any other common trench isolation dielectric. It should be recognized that the order of formation of sacrificial material region 404 and STI 450 may be switched, if desired.

Figure 14:
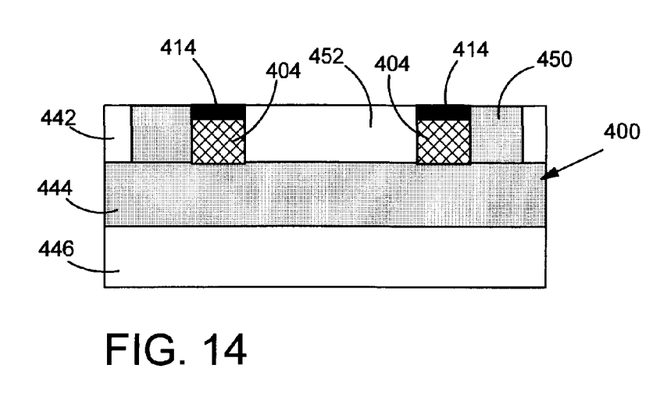

FIG. 14 shows an optional step in which a protective layer 414 is formed on top of each sacrificial material region 404. Each protective layer 414 may include, for example, silicon nitride ($Si_3N_4$), which improves compatibility with subsequent etch chemistries such as those for dual spacers for sacrificial material region(s) 404.

Figure 15:
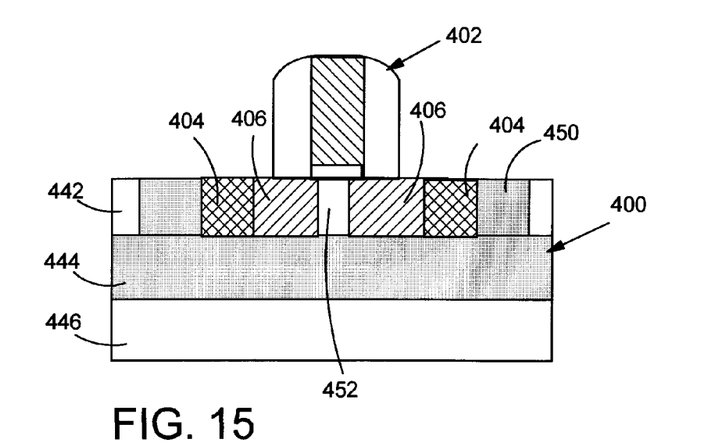
Figure 16:
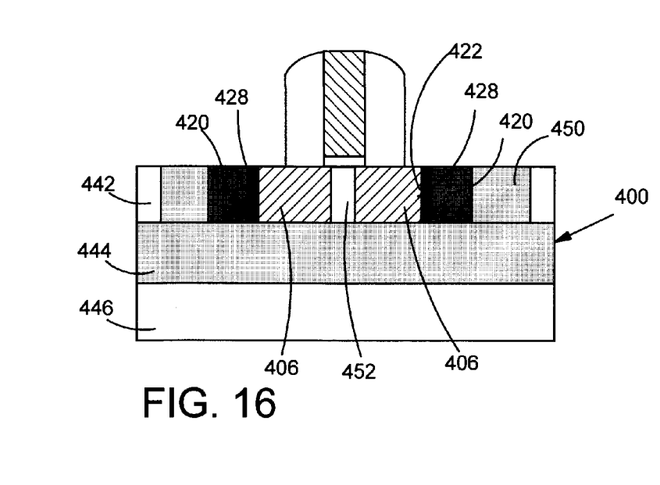

Next, as shown in FIG. 15, a diffusion 406 is formed in transistor region 452, i.e., by ion implantation. In addition, the rest of a transistor 402 may be completed, e.g., form gate electrode, spacers, gate oxide, gate silicide, etc. Finally, as shown in FIG. 16, each sacrificial material region 404 (FIG. 15) is replaced with a conductor to form interconnect 420 in electrical contact with a side 422 of diffusion 406. This step may include, for example, removing sacrificial material region(s) 404 (FIG. 15) by etching, depositing a conductor, (optionally) annealing to form silicide region(s) 428, and planarizing to remove excess conductor. It should be recognized that the steps of FIGS. 15 and 16 may be reversed, if desired.

Figure 17:
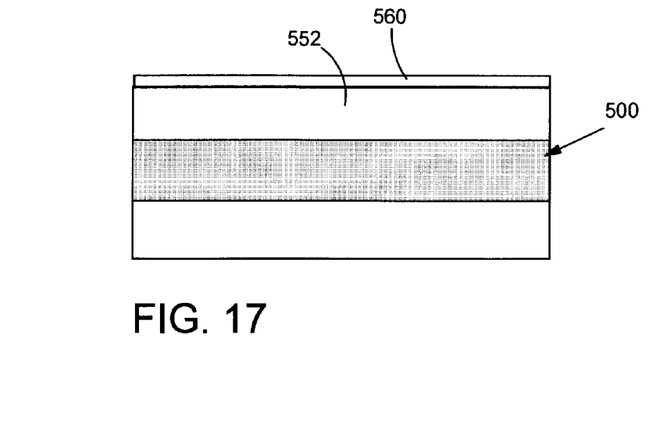
FIGS. 17-22 show a third embodiment of a method of electrically connecting to a diffusion of a transistor.
Figure 18:
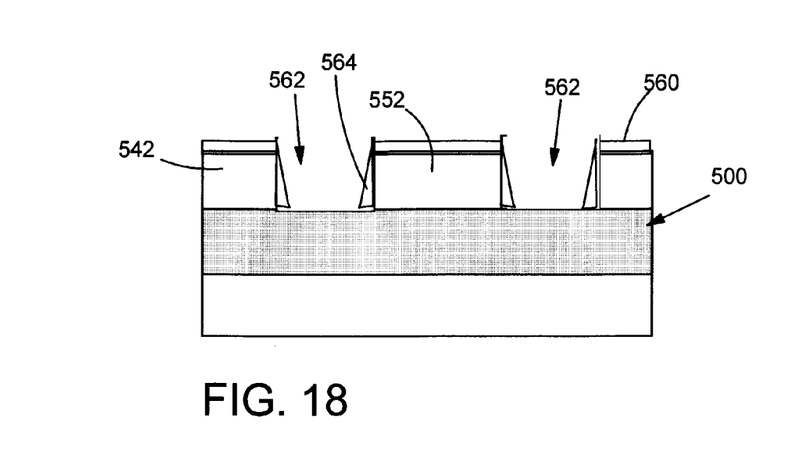
Figure 19:
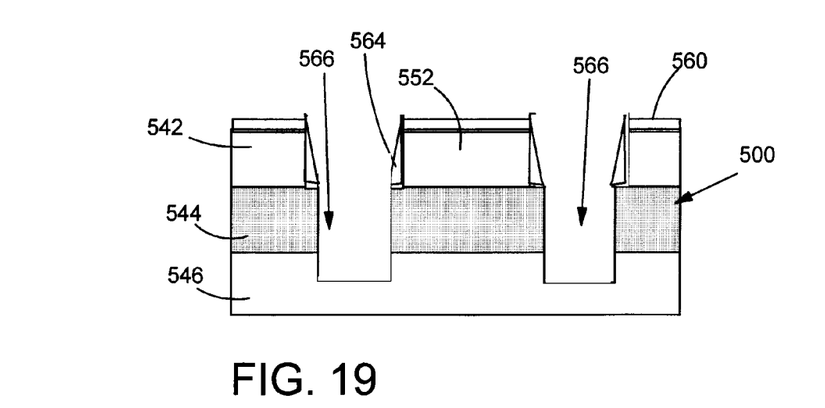
Figure 20:
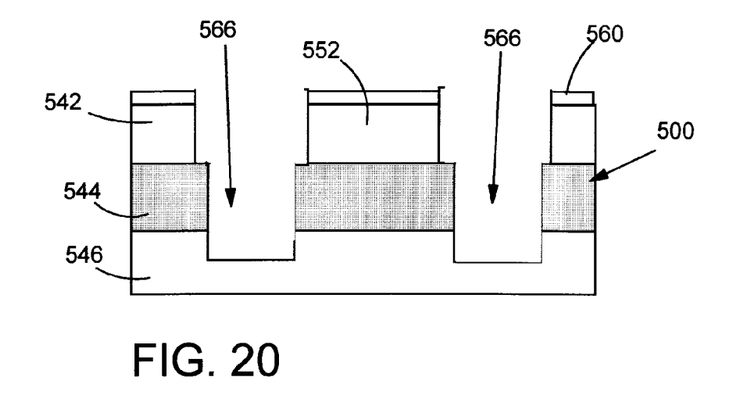
Figure 21:
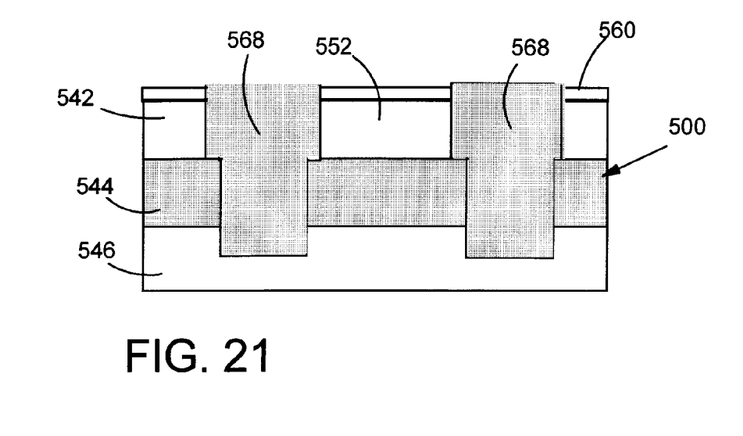

In one alternative for either embodiment described above, a deep trench isolation may be formed in place of, or in addition to, STI 150 (FIGS. 1 and 5-8) or STI 450 (FIGS. 12-16). For purposes of brevity, this alternative embodiment shall be explained mainly relative to the second embodiment of FIGS. 9-16. One with skill in the art will recognize, however, that the alternative embodiment is equally applicable to the first embodiment. In particular, deep trench isolation would be formed as part of steps shown in FIGS. 5-7, i.e., during the formation of the sacrificial regions. FIGS. 17-22 and 24 show one embodiment of forming deep trench isolation 568 (FIGS. 21-22) relative to the second embodiment of FIGS. 9-16. In this case, as shown in FIG. 21, a deep trench isolation 568 extends at least partially through an insulator layer 544 of an SOI substrate 500. As shown in FIG. 17, a first step may include depositing a protective layer 560, e.g., silicon nitride ($Si_3N_4$) or silicon dioxide ($SiO_2$), over SOI substrate 500, or at least a transistor region 552 thereof, to protect transistor region 552. Next, as shown in FIG. 18, a trench opening 562 is formed in a silicon-on-insulator layer 542 of SOI substrate 500, e.g., by mask patterning and etching (not shown), then etching of silicon-on-insulator layer 542. As also shown in FIG. 18, a protective spacer 564 (e.g., of $Si_3N_4$) may be formed for transistor region 552. Next, as shown in FIG. 19, a deep trench 566 is formed from the opening at least partially through insulator layer 544, i.e., either part way through insulator layer 544 or all the way through and into silicon-under-insulator layer 546, of SOI substrate 500. Next, as shown in FIG. 20, protective spacer 564 (FIGS. 18-19) is removed in any conventional manner. As shown in FIG. 21, deep trench 566 is then filled with a dielectric, e.g., TEOS, silicon dioxide ($SiO_2$), etc., to form deep trench isolation 568, and then planarized.

Figure 22:
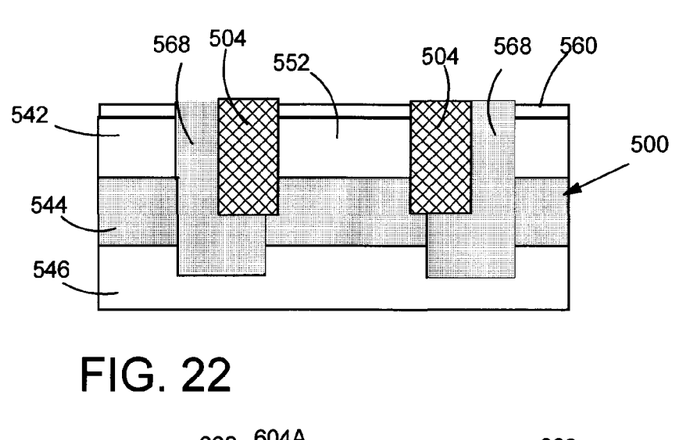
Figure 23:
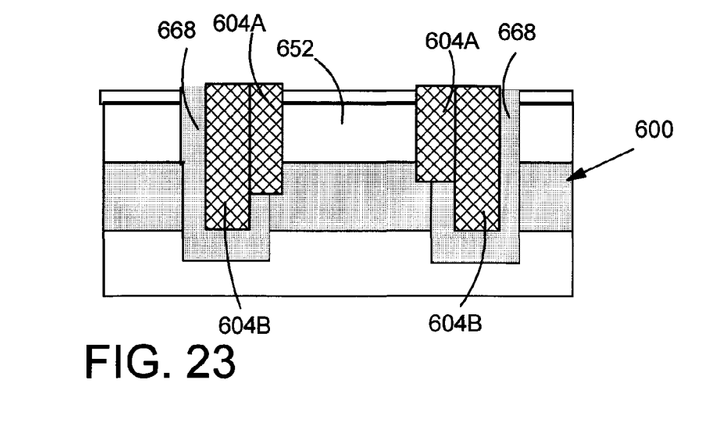
FIG. 23 shows an alternative step for the third embodiment of FIGS. 17-22.
Figure 24:
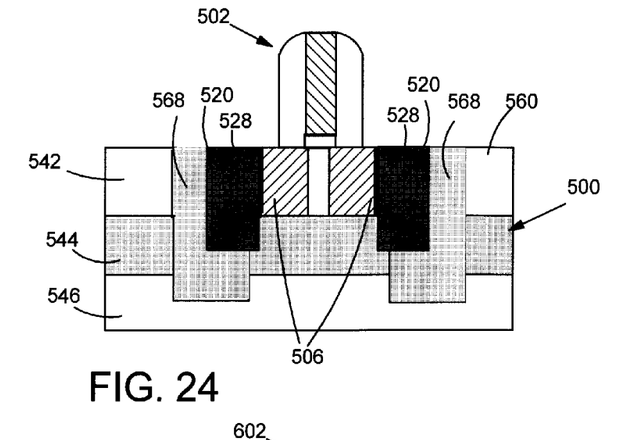
FIG. 24 shows a transistor structure formed according to the method of FIGS. 17-22.
Figure 25:
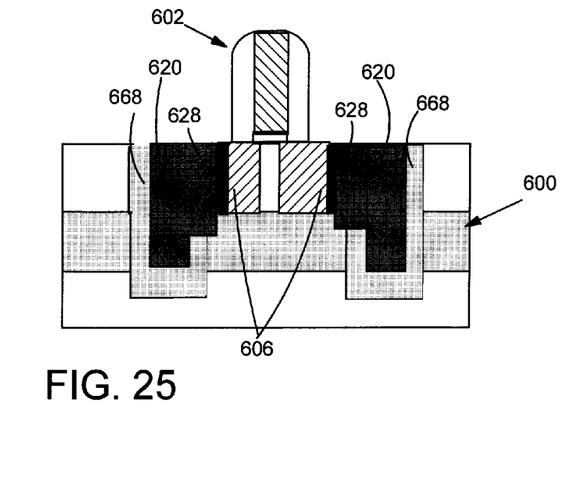
FIG. 25 shows a transistor structure formed according to the method of FIG. 24.

Turning to FIG. 22, at least one sacrificial material region 504 is then formed in the dielectric of deep trench isolation 568, e.g., by patterning and etching a mask with an opening that overlaps transistor region 552, depositing sacrificial material and planarizing (CMP). Each sacrificial material region 504 is in contact with transistor region 552. FIG. 23 shows an alternative embodiment of this step in which a sacrificial material region is formed by forming a first portion 604A of each sacrificial material region to a first depth in the dielectric, and forming a second portion 604B of each sacrificial material region to a second, different depth in the dielectric. This step could be accomplished using a dual or multiple damascene fill of sacrificial material. In this fashion, an interconnect formed in the space vacated by sacrificial material region 604A, 604B has the first and second depth in the dielectric. It should also be recognized that multiple widths may also be implemented using this alternative step. In any event, sacrificial material region 604B preferably has significant isolation from the substrate.

As described above and as shown in FIGS. 24 and 25, subsequent to the steps of FIG. 22 or 23, sacrificial material regions 504, 604A, 604B are replaced with a conductor to form interconnects 520, 620, respectively. As described above, an annealing step may be provided to form silicide portions 528, 628, if desired. Subsequently, any protective layer 560 (FIG. 22) is removed, and diffusions 506, 606, respectively, and the rest of the transistors 502, 602 are formed. Alternatively, transistors 502, 602 can be formed in the reverse order to interconnect 520, 620. In other words, transistors 502, 602 are formed first. As a result of the above-described alternative embodiment, at least one interconnect 520, 620 may be positioned in a deep trench isolation. In addition, at least one interconnect 520, 620 may have multiple depths and/or widths.

Where the deep trench isolation and/or multiple depth/width trench isolation is applied to the masking and etching (first) embodiment (FIGS. 1-8), the sacrificial material regions would not be employed and the openings would be filled with dielectric to form the trench isolation and/or conductor to form the interconnect, as the case may be. In this case, a deep trench would be formed at least partially through insulator layer of the SOI substrate, and the deep trench would be filled with a dielectric. An opening for the interconnect would then be formed into the dielectric and at least a portion of the already formed diffusion. A conductor would then be formed in the opening to form the interconnect, and any residual conductor would then be removed. The resulting structure would be the same as that shown in FIG. 24. As in the above description, the opening forming step for the deep trench version of the masking/etching embodiment, may also include forming a first portion of the opening to a first depth in the dielectric, and forming a second portion of the opening to a second, different depth in the dielectric such that the interconnect has the first and second depth in the dielectric. The resulting structure would be the same as that shown in FIG. 25.

Returning to FIGS. 1-2, each of the above-described embodiments may finish with the step of applying at least one stress liner film 130, and electrically connecting conductor 126 at a distance from the diffusion. (Stress liner films are not shown in FIGS. 8, 16, 24 and 25 for clarity). The stress liner film applied may differ over different transistors. For example, as shown in FIGS. 3-4, where two or more transistors 202A, 202B are used, the applying step may include applying a tensile stress liner film 230A to at least one transistor and a compressive stress liner film 230B to at least one other transistor. A pair of like diffusions 206 of adjacent transistors 202A, 202B may be electrically connected to an interconnect 206 therebetween.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A transistor structure comprising:
   at least one transistor including a diffusion and an interconnect electrically connected to a side of the diffusion;
   a stress liner film over the at least one transistor structure; and a conductor in electrical contact with the interconnect extending from the interconnect perpendicular to the stress liner film wherein the conductor does not interrupt the stress liner film.

2. The transistor structure of claim 1, wherein the diffusion includes a source diffusion and a drain diffusion for a transistor, and an interconnect is electrically connected to each of the diffusions.

3. The transistor structure of claim 1, wherein the at least one transistor includes at least two transistors, and wherein a pair of like diffusions of adjacent transistors are each electrically connected to the interconnect therebetween.

4. The transistor structure of claim 1, wherein the at least one transistor includes at least two transistors, and further comprising a tensile stress liner film over at least one transistor and a compressive stress liner film over at least one other transistor.

5. The transistor structure of claim 1, wherein the interconnect is positioned in a deep trench isolation.

6. A transistor structure comprising:
   at least one transistor including a diffusion and an interconnect electrically connected to a side of the diffusion;
   at least one stress liner film over the at least one transistor; and
   a conductor in electrical contact with the interconnect at a distance from the diffusion extending from the interconnect perpendicular to the stress liner film wherein the conductor does not interrupt the at least one stress liner film.

7. The transistor structure of claim 6, wherein the diffusion includes a source diffusion and a drain diffusion for a transistor, and an interconnect is electrically connected to each of the diffusions.

8. The transistor structure of claim 6, wherein the at least one transistor includes at least two transistors, and wherein a pair of like diffusions of adjacent transistors are each electrically connected to an interconnect therebetween.

9. The transistor structure of claim 6, wherein the at least one transistor includes at least two transistors, and further comprising a tensile stress liner film over at least one transistor and a compressive stress liner film over at least one other transistor.

* * * * *